US011136498B2

(12) United States Patent
Ono

(10) Patent No.: US 11,136,498 B2
(45) Date of Patent: Oct. 5, 2021

(54) CORE SHELL PARTICLE, METHOD OF PRODUCING CORE SHELL PARTICLE, AND FILM

(71) Applicant: FUJIFILM Corporation, Tokyo (JP)

(72) Inventor: Masashi Ono, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 445 days.

(21) Appl. No.: 15/812,559

(22) Filed: Nov. 14, 2017

(65) Prior Publication Data
US 2018/0066182 A1 Mar. 8, 2018

Related U.S. Application Data

(63) Continuation of application No. PCT/JP2016/063764, filed on May 9, 2016.

(30) Foreign Application Priority Data

May 15, 2015 (JP) ............................ JP2015-099649

(51) Int. Cl.
C09K 11/08 (2006.01)
C09K 11/62 (2006.01)
C09K 11/70 (2006.01)
C01B 25/08 (2006.01)
C01G 15/00 (2006.01)
C09K 11/74 (2006.01)
C09K 11/56 (2006.01)
C09K 11/02 (2006.01)
C09K 11/54 (2006.01)
H01L 51/00 (2006.01)

(52) U.S. Cl.
CPC .......... C09K 11/0883 (2013.01); C01B 25/08 (2013.01); C01G 15/00 (2013.01); C09K 11/02 (2013.01); C09K 11/08 (2013.01); C09K 11/54 (2013.01); C09K 11/56 (2013.01); C09K 11/565 (2013.01); C09K 11/62 (2013.01); C09K 11/70 (2013.01); C09K 11/74 (2013.01); H01L 51/0043 (2013.01); C09K 2211/188 (2013.01)

(58) Field of Classification Search
CPC .................................................. C09K 11/0883
See application file for complete search history.

(56) References Cited

U.S. PATENT DOCUMENTS

| 7,687,800 | B1 | 3/2010 | Kar et al. | |
| 2009/0230382 | A1 | 9/2009 | Banin et al. | |
| 2010/0159248 | A1* | 6/2010 | Jang ........................ | C09K 11/70 428/403 |
| 2010/0163798 | A1 | 7/2010 | Ryowa et al. | |
| 2014/0264172 | A1 | 9/2014 | Daniels et al. | |
| 2014/0326949 | A1* | 11/2014 | Xu ........................ | C09K 11/02 257/13 |

FOREIGN PATENT DOCUMENTS

| JP | 2008-544013 A | 12/2008 |
| JP | 2010-155872 A | 7/2010 |
| JP | 5137825 B2 | 2/2013 |
| KR | 10-2013-0080333 A | 7/2013 |

OTHER PUBLICATIONS

Aharoni et al., "Synthesis of InAs/CdSe/ZnSe core/shell1/shell2 structures with bright and stable near-infrared fluorescence," Journal of the American Chemical Society, vol. 128, No. 1, 2006 (published on web Dec. 7, 2005), pp. 257-264.
International Preliminary Report on Patentability and Written Opinion of the International Searching Authority (Forms PCT/IB/373, PCT/IB/326 and PCT/ISA/237), dated Nov. 30, 2017, for International Application No. PCT/JP2016/063764, with an English translation of the Written Opinion.
International Search Report and English translation (Form PCT/ISA/210), dated Jul. 26, 2016, for International Application No. PCT/JP2016/063764.
Kim et al., "Highly luminescing multi-shell semiconductor nanocrystals InP/ZnSe/ZnS," Applied Physics Letters, vol. 101, 2012 (published online Aug. 14, 2012), pp. 073107-1-073107-4 (5 pages total).
Virieux et al., "InP/ZnS nanocrystals: Coupling NMR and XPS for fine surface and interface description," Journal of the American Chemical Society, vol. 134, Nov. 6, 2012, pp. 19701-19708.
Japanese Office Action dated Nov. 27, 2018, for corresponding Japanese Patent Application No. 2017-519125, with an English translation.
Kim et al., "Highly Luminescent InP/GaP/ZnS Nanocrystals and Their Application to White Light-Emitting Diodes", Journal of the American Chemical Society, vol. 134, Feb. 3, 2012, pp. 3804-3809.
Chinese Office Action and Search Report, dated Sep. 29, 2019, for Chinese Application No. 201680028000.x.
Extended European Search Report, dated May 24, 2018, for European Application No. 16796327.1.
Chinese Office Action dated Feb. 25, 2020, for Chinese Application No. 201680028000.X.
European Office Action, dated Jul. 6, 2020, for corresponding European Application No. 16796327.1.

* cited by examiner

Primary Examiner — Christopher S Kessler
(74) Attorney, Agent, or Firm — Birch, Stewart, Kolasch & Birch, LLP

(57) ABSTRACT

An object of the present invention is to provide a core shell particle exhibiting high luminous efficacy, a method of producing the core shell particle, and a film containing the core shell particle. The core shell particle of the present invention includes a core which contains a Group III element and a Group V element; a first shell which covers at least a part of a surface of the core; and a second shell which contains a Group II element and covers at least a part of the first shell, in which the molar ratio of the Group II element contained in the entirety of the core shell particle to the Group III element contained in the core, which is acquired using X-ray photoelectron spectroscopy, is 2.7 or greater.

18 Claims, No Drawings

CORE SHELL PARTICLE, METHOD OF PRODUCING CORE SHELL PARTICLE, AND FILM

CROSS-REFERENCE TO RELATED APPLICATIONS

This application is a Continuation of PCT International Application No. PCT/JP2016/063764 filed on May 9, 2016, which claims priority under 35 U.S.C. § 119(a) to Japanese Patent Application No. 2015-099649 filed on May 15, 2015. The above application is hereby expressly incorporated by reference, in its entirety, into the present application.

BACKGROUND OF THE INVENTION

1. Field of the Invention

The present invention relates to a core shell particle, a method of producing the same, and a film containing the core shell particle.

2. Description of the Related Art

As semiconductor fine particles which are expected to be applied to colloidal semiconductor nanoparticles (so-called quantum dots), Group II-VI semiconductor fine particles or Group III-V semiconductor fine particles have been known.

The particle diameter of these semiconductor fine particles is several nanometers to several tens of nanometers.

Further, a band gap typically becomes larger as the particle diameter of particles having such a nanoscale decreases due to so-called quantum size effects, and the particles exhibit light emission in a short wavelength range such as an ultraviolet region or a near ultraviolet region.

Therefore, in order to use optical characteristics specific to the semiconductor fine particles, applications to various devices such as a piezoelectric element, an electronic device, a light-emitting element, and a laser have been researched and developed.

For example, JP5137825B discloses, as semiconductor nanoparticles, "core/multiple shell semiconductor nanocrystals which include a core material formed of a Group III/V compound; and at least two shell materials, in which the core material is coated with the first shell material, the first shell material is coated with the second shell material, the previous shell material is sequentially coated with the subsequent shell material, each shell material is independently selected from Group II/VI, Group III/V, and Group III/VI compounds, the core material is different from the first shell material, each shell material is different from the shell material of the adjacent shell thereof, and the nanocrystals exhibit a type I band offset and luminescence with a wavelength of 400 nm to 1600 nm".

SUMMARY OF THE INVENTION

With the expansion of the applications of quantum dots recently, further improvement of luminous efficacy has been required.

As the result of examination performed by the present inventors on core shell type quantum dots with reference to JP5137825B or the like, it became evident that the luminous efficacy is not necessarily sufficient.

The present invention has been made in consideration of the above-described circumstances, and an object thereof is to provide a core shell particle exhibiting high luminous efficacy, a method of producing the core shell particle, and a film containing the core shell particle.

As the result of the intensive research conducted by the present inventors in order to achieve the above-described object, it was found that the above-described problem can be solved by setting the molar ratio between a Group III element contained in a core and a Group II element contained in the entirety of the core shell particle to be in a specific range, and the present invention has been completed.

In other words, the present inventors found that the above-described problem can be solved by the following configurations.

(1) A core shell particle comprising: a core which contains a Group III element and a Group V element; a first shell which covers at least a part of a surface of the core; and a second shell which contains a Group II element and covers at least a part of the first shell, in which the molar ratio of the Group II element contained in the entirety of the core shell particle to the Group III element contained in the core, which is acquired using X-ray photoelectron spectroscopy, is 2.7 or greater.

(2) The core shell particle according to (1), in which the molar ratio is 3.0 or greater.

(3) The core shell particle according to (1) or (2), in which the Group III element contained in the core is In, and the Group V element contained in the core is any of P, N, and As.

(4) The core shell particle according to (3), in which the Group III element contained in the core is In, and the Group V element contained in the core is P.

(5) The core shell particle according to any one of (1) to (4), in which the core further contains a Group II element.

(6) The core shell particle according to (5), in which the Group II element contained in the core is Zn.

(7) The core shell particle according to any one of (1) to (6), in which the first shell contains a Group II element or a Group III element, where, in a case where the first shell contains a Group III element, the Group III element contained in the first shell is a Group III element different from the Group III element contained in the core.

(8) The core shell particle according to any one of (1) to (7), in which the first shell is a Group II-VI semiconductor which contains a Group II element and a Group VI element or a Group III-V semiconductor which contains a Group III element and a Group V element, where, in a case where the first shell is the Group III-V semiconductor, the Group III element contained in the Group III-V semiconductor is a Group III element different from the Group III element contained in the core.

(9) The core shell particle according to (8), in which in a case where the first shell is the Group II-VI semiconductor, the Group II element is Zn and the Group VI element is Se, and in a case where the first shell is the Group III-V semiconductor, the Group III element is Ga and the Group V element is P.

(10) The core shell particle according to (8), in which the first shell is the Group III-V semiconductor, the Group III element is Ga, and the Group V element is P.

(11) The core shell particle according to any one of (1) to (10), in which the second shell is a Group II-VI semiconductor which contains a Group II element and a Group VI element.

(12) The core shell particle according to (11), in which the second shell is the Group II-VI semiconductor, the Group II element is Zn, and the Group VI element is S.

(13) The core shell particle according to any one of (1) to (12), in which the core, the first shell, and the second shell are respectively a crystal system having a zinc blende structure.

(14) The core shell particle according to any one of (1) to (13), in which, among the core, the first shell, and the second shell, a band gap of the core is the smallest, and the core and the first shell respectively have a type 1 band structure.

(15) A method of producing a core shell particle for synthesizing the core shell particle according to any one of (1) to (14), the method including: a first step of heating and stirring a solution obtained by adding a Group III raw material which contains a Group III element to a solvent; a second step of forming a core by adding a Group V raw material which contains a Group V element to the solution after the first step; a third step of forming a first shell by adding a raw material of the first shell to the solution after the second step; and a fourth step of synthesizing a core shell particle by adding a Group II raw material which contains a Group II element to the solution after the third step and by forming a second shell, in which the molar ratio of the Group II raw material added in all steps from the first step to the fourth step to the Group III raw material added in the first step is greater than 3.0.

(16) The method of producing a core shell particle according to (15), in which the Group III raw material is a compound containing In.

(17) The method of producing a core shell particle according to (15) or (16), in which the Group V raw material is a compound containing P.

(18) The method of producing a core shell particle according to any one of (15) to (17), in which the raw material of the first shell is a compound containing Ga.

(19) The method of producing a core shell particle according to (18), in which the raw material of the first shell is a chloride of Ga.

(20) The method of producing a core shell particle according to any one of (15) to (19), in which the raw material of the second shell is a compound containing Zn.

(21) The method of producing a core shell particle according to (20), in which the raw material of the second shell is a carboxylate of Zn.

(22) A film which contains the core shell particle according to any one of (1) to (14).

According to the present invention, as described below, it is possible to provide a core shell particle exhibiting high luminous efficacy; a method of producing the core shell particle, and a film containing the core shell particle.

DESCRIPTION OF THE PREFERRED EMBODIMENTS

Hereinafter, the present invention will be described in detail.

The description of constituent elements below will be occasionally made based on representative embodiments of the present invention, but the present invention is not limited to these embodiments.

In the present specification, the numerical ranges expressed using "to" in the present specification indicate the ranges including the numerical values described before and after "to" as the lower limits and the upper limits.

Core Shell Particle

A core shell particle of the present invention includes a core which contains a Group III element and a Group V element; a first shell which covers at least a part of a surface of the core; and a second shell which contains a Group II element and covers at least a part of the first shell, in which the molar ratio of the Group II element contained in the entirety of the core shell particle to the Group III element contained in the core, which is acquired using X-ray photoelectron spectroscopy (hereinafter, "the molar ratio of the Group II element contained in the entirety of the core shell particle to the Group III element contained in the core, which is acquired using X-ray photoelectron spectroscopy" is also referred to as a "core shell ratio"), is 2.7 or greater.

It is considered that the core shell particle of the present invention exhibits high luminous efficacy by employing such a configuration. The reason is not clear, but can be assumed as follows.

Defects of the core surface (defects of the core shell surface) or defects of the shell surface are considered as a main factor of deterioration in emission characteristics of core shell type quantum dots. Particularly in the latter case, the luminous efficacy is lowered by excitons generated in the core tunneling the surface of some particles and being trapped by the surface of the particles.

In the core shell particle of the present invention, since the above-described core shell ratio is greater than or equal to a specific value, the core or the first shell is sufficiently covered with a Group II element. Therefore, it is considered that the above-described trapping of excitons is unlikely to occur and thus the core shell particle exhibits high luminous efficacy.

As described above, in the core shell particle of the present invention, the molar ratio (core shell ratio) of the Group II element contained in the entirety of the core shell particle to the Group III element contained in the core, which is acquired using X-ray photoelectron spectroscopy (hereinafter, also referred to as XPS), is 2.7 or greater.

Here, the core shell ratio is acquired in the following manner.

The core shell ratio thereof is acquired by measuring the XPS of the core shell particle and correcting the ratio of the peak intensity of the Group II element contained in the entirety of the core shell particle to the peak intensity of the Group III element contained in the core with a relative sensitivity coefficient for each element. The relative sensitivity coefficient is acquired by measuring measurement elements (measurement trajectory) to be described later related to standard samples whose compositions have been known (Journal of Surface Analysis Vol. 12 No. 3, pp. 357 (2005)).

Further, the peak intensity indicates the area intensity obtained by subtracting the background from the peak observed under the following measurement conditions and integrating the area of the peak with respect to the energy.

Further, the XPS measurement is performed by using a sample obtained by coating a non-doped Si substrate with a dispersion liquid (solvent: toluene) containing core shell particles and drying the substrate.

Measurement Conditions

Measuring device: Quantera SXM type XPS (manufactured by ULVAC-PHI, Inc.)
X-ray source: Al-Kα ray (analytic diameter: 100 μm, 25 W, 15 kV)
Extraction angle of photoelectrons: 45° C.
Measurement range: 300 μm×300 μm
Correction: charging correction using combination of electron gun and low-speed ion gun Measurement elements (measurement trajectory): C (1 s), N (1 s), O (1 s), Si (2p), P (2p), S (2p), Cl (2p), Zn (2p3/2), Ga (2p3/2), In (3 d5/2)

From the viewpoint of further increasing the luminous efficacy, the core shell ratio is preferably 4.6 or greater and more preferably 5.0 or greater. The upper limit thereof is not particularly limited, but is preferably 15.0 or less and more preferably 10.0 or less from the viewpoint of the luminous efficacy.

Further, the molar ratio [hereinafter, also referred to as a "molar ratio (Group III/Group V)] of the Group III element contained in the core to the Group V element contained in the entirety of the core shell particles is not particularly limited, but is preferably greater than 2.2 from the viewpoint of further increasing the luminous efficacy. In addition, from the viewpoint of further increasing the luminous efficacy, the molar ratio (Group III/Group V) is preferably in a range of 2.5 to 5.0, more preferably in a range of 3.0 to 5.0, still more preferably in a range of 3.0 to 4.0, particularly preferably in a range of 3.0 to 3.5, and most preferably greater than 3.0 and less than 3.5. The molar ratio (Group III/Group V) is acquired in conformity with the method of calculating, the core shell ratio described above.

Core

The core contained in the core shell particle of the present invention is a so-called Group III-V semiconductor that contains a Group III element and a Group V element.

Group III Element

Specific examples of the Group III element include indium (In), aluminum (Al), and gallium (Ga). Among these, In is preferable.

Group V Element

Specific examples of the Group V element include phosphorus (P), nitrogen (N), and arsenic (As). Among these, P is preferable.

In the present invention, a Group III-V semiconductor obtained by appropriately combining the Group III element and the Group V element exemplified above can be used as the core, but InP, InN, or InAs is preferable from the viewpoint that the luminous efficacy is further increased, the luminous half-width is narrowed, and a clear exciton peak is obtained. Among these, from the viewpoint of further increasing the luminous efficacy, InP is more preferable.

In the present invention, it is preferable that the core further contains a Group II element in addition to the Group III element and the Group V element described above. Particularly in a case where the core is InP, the lattice constant is decreased by doping Zn as the Group II element and the lattice matching performance with a shell (for example, GaP, ZnS, or the like described below) having a smaller lattice constant than that of InP becomes excellent.

First Shell

In the core shell particle of the present invention, at least a part of the surface of the core is covered by the first shell.

Here, it is possible to confirm whether at least a part of the surface of the core is covered with the first shell based on composition distribution analysis according to energy dispersive X-ray spectroscopy (TEM-EDX) using a transmission electron microscope.

In the present invention, from the viewpoint of reducing defects of the interface between the core particles and the first shell, it is preferable that the first shell contains a Group II element or a Group III element.

Here, in a case where the first shell contains a Group III element, the Group III element contained in the first shell is a Group III element different from the Group III element contained in the core described above.

Further, in addition to a Group II-VI semiconductor and a Group III-V semiconductor described below, a Group III-VI semiconductor (such as $Ga_2O_3$, $Ga_2S_3$, or the like) containing a Group III element and a Group VI element is exemplified as the first shell containing a Group II element or a Group III element.

In the present invention, from the viewpoint of obtaining an excellent crystal phase with less defects, it is preferable that the first shell is a Group II-VI semiconductor containing a Group II element and a Group VI element or a Group III-V semiconductor containing a Group III element and a Group V element and more preferable that the first shell is a Group III-V semiconductor.

Here, in a case where the first shell is a Group III-V semiconductor, the Group III element contained in the Group III-V semiconductor is a Group III element different from the Group III element contained in the core described above.

Group II-VI Semiconductor

Specific examples of the Group II element contained in the Group II-VI semiconductor include zinc (Zn), cadmium (Cd), and magnesium (Mg). Among these, Zn is preferable.

Further, specific examples of the Group VI element contained in the Group II-VI semiconductor include sulfur (S), oxygen (O), selenium (Se), and tellurium (Te). Among these, S or Se is preferable and S is more preferable.

A Group II-VI semiconductor obtained by appropriately combining the Group II element and the Group VI element described above can be used as the first shell, but it is preferable that the first shell is a crystal system (for example, a zinc blende structure) which is the same as or similar to the core described above. Specifically, ZnSe, ZnS, or a mixed crystal of these is preferable and ZnSe is more preferable.

Group III-V Semiconductor

Specific examples of the Group III element contained in the Group III-V semiconductor include indium (In), aluminum (Al), and gallium (Ga). Among these, Ga is preferable. As described above, the Group III element contained in the Group III-V semiconductor is a Group III element different from the Group III element contained in the core described above. For example, in a case where the Group III element contained in the core is In, the Group III element contained in the Group III-V semiconductor is Al, Ga, or the like.

Further, specific examples of the Group V element contained in the Group III-V semiconductor include phosphorus (P), nitrogen (N), and arsenic (As). Among these, P is preferable.

A Group III-V semiconductor obtained by appropriately combining the Group III element and the Group V element described above can be used as the first shell, but it is preferable that the first shell is a crystal system (for example, a zinc blende structure) which is the same as or similar to the core described above. Specifically, GaP is preferable.

In the present invention, from the viewpoint of reducing defects of the surface of the core shell particle to be obtained, it is preferable that a difference in lattice constant between the above-described core and the first shell is small. Specifically, it is preferable that the difference in lattice constant between the above-described core and the first shell is 10% or less.

Specifically, in a case where the above-described core is InP, it is preferable that the first shell is ZnSe (difference in lattice constant: 3.4%) or GaP (difference in lattice constant: 7.1%) as described above. Particularly, it is more preferable that the first shell is the same Group III-V semiconductor as the core and the Group III-V semiconductor is GaP from the viewpoint that a mixed crystal state can be easily made on the interface between the core and the first shell.

In the present invention, in a case where the first shell is a Group III-V semiconductor, the first shell may contain or dope another element (for example, the Group II element or the Group VI element described above) within the range that does not affect the magnitude correlation (core<first shell) of the band gap between the core and the first shell. Similarly, in a case where the first shell is a Group II-VI semiconductor, the first shell may contain or dope another element (for example, the Group III element or the Group V element described above) within the range that does not affect the magnitude correlation (core<first shell) of the band gap between the core and the first shell.

Second Shell

In the core shell particle of the present invention, at least a part of the surface of the first shell is covered with the second shell containing a Group II element.

Here, it is possible to confirm whether at least a part of the surface of the first shell is covered with the second shell based on composition distribution analysis according to energy dispersive X-ray spectroscopy (TEM-EDX) using a transmission electron microscope.

In the present invention, from the viewpoints of suppressing defects of the interface between the first shell and the second shell and allowing the shell layer itself to obtain an excellent crystal phase with less defects, it is preferable that the second shell is a Group II-VI semiconductor containing a Group II element and a Group VI element.

Examples of the Group II element and the Group VI element include those described in the section of the first shell.

A Group II-VI semiconductor obtained by appropriately combining the Group II element and the Group VI element described above can be used as the second shell, but it is preferable that the second shell is a crystal system (for example, a zinc blende structure) which is the same as or similar to the core described above. Specifically, ZnSe, ZnS, or a mixed crystal of these is preferable and ZnS is more preferable.

In the present invention, from the viewpoint of reducing defects of the surface of the core shell particle to be obtained, it is preferable that a difference in lattice constant between the above-described first shell and the second shell is small. Specifically, it is preferable that the difference in lattice constant between the above-described first shell and the second shell is 10% or less.

Specifically, in a case where the above-described first shell is GaP, it is preferable that the second shell is ZnSe (difference in lattice constant: 3.8%) or ZnS (difference in lattice constant: 0.8%) as described above and more preferable that the second shell is ZnS.

In the present invention, in a case where the second shell is a Group II-VI semiconductor, the second shell may contain or dope another element (for example, the Group III element or the Group V element described above) within the range that does not affect the magnitude correlation (core<second shell) of the band gap between the core and the second shell.

In the present invention, from the viewpoint that epitaxial growth of the shell layer becomes easy and defects of an interface between layers are easily suppressed, it is preferable that each of the core, the first shell, and the second shell described above is a crystal system having a zinc blende structure.

In the present invention, from the viewpoint that the probability of excitons staying in the core becomes higher and the luminous efficacy is further increased, it is preferable that the band gap of the core from among the core, the first shell, and the second shell is the smallest and the core and the first shell are core shell particles having a type 1 (type I) band structure.

Coordination Molecule

From the viewpoint of imparting dispersibility, it is desirable that the surface of the core shell particle of the present invention has coordination molecules.

From the viewpoint of dispersibility in a solvent, it is preferable that the coordination molecules contain aliphatic hydrocarbon.

Further, from the viewpoint of improving the dispersibility, a coordination molecule is preferably a ligand in which the number of carbon atoms in the main chain is at least 6 and more preferably a ligand in which the number of carbon atoms in the main chain is 10 or greater.

The coordination molecule may be a saturated compound or an unsaturated compound, and specific examples thereof include decanoic acid, lauric acid, myristic acid, palmitic acid, stearic acid, behenic acid, oleic acid, erucic acid, oleylamine, dodecylamine, dodecanethiol, 1,2-hexadecanethiol, trioctylphosphine oxide, and cetrimonium bromide, and these may be used alone or in combination of two or more kinds thereof.

Average Particle Diameter

From the viewpoints of easily synthesizing particles having a uniform size and easily controlling the emission wavelength using quantum size effects, the average particle diameter of the core shell particles of the present invention is preferably 2 nm or greater and more preferably 10 nm or less.

Here, the average particle diameter is a value obtained by directly observing at least 20 particles using a transmission electron microscope, calculating the diameters of circles having the same area as the projected area of the particles, and arithmetically averaging these values.

Method of Producing Core Shell Particle

A method of producing the core shell particle of the present invention (hereinafter, also referred to as the "production method of the present invention") is a method for synthesizing the core shell particle of the present invention described above. The method includes the first step to the fourth step described below.

A first step (1) of heating and stirring a solution obtained by adding a Group III raw material which contains a Group III element to a solvent A second step (2) of forming a core by adding a Group V raw material which contains a Group V element to the solution after the first step A third step (3) of forming a first shell by adding a raw material of the first shell to the solution after the second step; and A fourth step (4) of synthesizing the core shell particle by adding a Group II raw material which contains a Group II element to the solution after the third step to form the second shell Here, the molar ratio of the Group II raw material added in all steps from the first step to the fourth step to the Group III raw material added in the first step is greater than 3.

Hereinafter, each step will be described.

First Step

The first step is a step of heating and stirring a solution obtained by adding a Group III raw material which contains a Group III element to a solvent.

Solvent

Preferred examples of the solvent used in the first step include non-polar solvents having a boiling point of 170° C. or higher.

Specific examples of the non-polar solvents include aliphatic saturated hydrocarbon such as n-decane, n-dodecane, n-hexadecane, or n-octadecane; aliphatic unsaturated hydrocarbon such as 1-undecene, 1-dodecene, 1-hexadecene, or 1-octadecene; trioctylphosphine.

Among these, aliphatic unsaturated hydrocarbon having 12 or greater carbon atoms is preferable and 1-octadecene is more preferable.

Group III Raw Material

Specific examples of the Group III raw material to be added to the solvent include indium chloride, indium oxide, indium nitrate, indium sulfate, indium acid; aluminum phosphate, aluminum acetylacetonate, aluminum chloride, aluminum fluoride, aluminum oxide, aluminum nitrate, aluminum sulfate; gallium acetylacetonate, gallium chloride, gallium fluoride, gallium oxide, gallium nitrate, and gallium sulfate, and these may be used alone or in combination of two or more kinds thereof.

Among these, from the viewpoints of easily realizing excellent luminous efficacy and easily controlling the emission wavelength in a visible range, an indium compound is preferable. From the viewpoint that impurity ions such as a chloride are unlikely to be taken into the core and excellent crystallinity is easily realized, it is more preferable to use indium acetate.

Group II Raw Material

In the production method of the present invention, a Group II raw material containing a Group II element may be added together with the Group III raw material described above during the first step.

Specific examples of the Group II raw material including a Group II element include dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc acetate, and zinc sulfate.

Among these, from the viewpoints that impurities such as a chloride ion are not contained and the compatibility with the coordination molecule described above and the solubility in a solvent are relatively high, it is preferable to use zinc acetate, which is an acetate of Zn.

Coordination Molecule

Coordination molecules may be added to the solvent in the first step. Examples of the coordination molecule used in the first step are the same as those described in the section of the core shell particle of the present invention described above. Among those, from the viewpoints of promoting the synthesis of the core and having an appropriate coordination force with respect to the core, oleic acid, palmitic acid, and stearic acid are preferable.

Conditions for Heating and Stirring

In the first step, it is preferable that the above-described respective materials (the Group III raw material, the Group II raw material, and the coordination molecules) are dissolved in the solvent and also preferable that the coordination molecules and the Group III raw material are dissolved in the solvent by heating and stirring the solution in a temperature range of 100° C. to 180° C. At this time, it is preferable that dissolved oxygen or moisture is removed from the mixed solution, in which the coordination molecules and the Group III raw material have been dissolved, by heating the solution under reduced pressure.

Further, the time required for heating and dissolving is preferably 30 minutes or longer.

Second Step

The second step is a step of forming a core by adding a Group V raw material which contains a Group V element to the solution after the first step.

It is preferable that the molar ratio of the Group V raw material added in the second step to the Group III raw material added in the first step is smaller than 0.5. In this manner, the core shell particle in which the molar ratio of the Group III element contained in the core to the Group V element contained in the entirety of the core shell particle, which is acquired from X-ray photoelectron spectroscopy analysis, is greater than 2.2 are obtained and the core shell particle exhibits excellent luminous efficacy.

Further, the "molar ratio of the Group V raw material added in the second step to the Group III raw material added in the first step" indicates a molar ratio of the Group V raw material added in the second step to the Group III raw material added in the first step even in a case where a part of the Group V raw material added in the second step is used as the raw material of the first shell in the third step.

Further, from the viewpoint of easily forming a Group III rich surface, the molar ratio of the Group V raw material added in the second step to the Group III raw material added in the first step is preferably less than 0.4 and more preferably in a range of 0.38 to 0.25.

Group V Raw Material

Specific examples of the Group V raw material containing a Group V element include tristrialkylsilylphosphine, trisdialkylsilylphosphine, trisdialkylaminophosphine; arsenic oxide, arsenic chloride, arsenic sulfate, arsenic bromide, arsenic iodide, nitric oxide, nitric acid, and ammonium nitrate.

Among these, a compound containing P is preferable. As the compound, it is preferable to use tristrialkylsilylphosphine or trisdialkylaminophosphine. Specifically, it is more preferable to use tristrimethylsilylphosphine.

Third Step

The third step is a step of forming a first shell by adding a raw material of the first shell to the solution after the second step.

Here, as the raw material of the first shell, a Group II raw material containing the Group II element described above and a Group VI raw material containing the Group VI element described below are exemplified in a case where the first shell is the Group II-VI semiconductor; and a Group III raw material containing the Group III element described above and a Group V raw material containing the Group V element described above are exemplified in a case where the first shell is the Group III-V semiconductor described above.

Here, in a case where the first shell is the Group III-V semiconductor described above, the Group III element contained in the Group III-V semiconductor is a Group III element different from the Group III element contained in the core as described in the section of the core shell particle of the present invention.

Further, in a case where the first shell is the Group III-V semiconductor described above, since the Group V raw material containing a Group V element is the same raw material as the Group V raw material forming the core, a part of the Group V raw material used in the second step may be used and only the Group III raw material may be added in the third step.

Group VI Raw Material

Specific examples of the Group VI raw material containing a Group VI element include sulfur, alkylthiol, trialkylphosphine sulfide, trialkenylphosphine sulfide, alkylamino sulfide, alkenylamino sulfide, cyclohexyl isothiocyanate, diethyl dithiocarbamic acid, trialkylphosphine selenium, trialkenylphosphine selenium, alkylamino selenium, alkenylamino selenium, trialkylphosphine telluride, trialkenylphosphine telluride, alkylamino telluride, and alkenylamino telluride.

Among these, from the viewpoint of excellent dispersibility of core shell particles to be obtained, it is preferable to use alkylthiol, specifically, more preferable to use dodecanethiol or octanethiol, and still more preferable to use dodecanethiol.

Among these materials, it is preferable to use the Group III raw material and the Group V raw material.

Particularly, as the Group III raw material, it is more preferable to use a compound containing Ga (such as gallium acetylacetonate, gallium chloride, gallium fluoride, gallium oxide, gallium nitrate, or gallium sulfate) and still more preferable to use a chloride of Ga.

In addition, as the Group V raw material, it is preferable to use a part of the Group V raw material used in the second step as described above.

Fourth Step

The fourth step is a step of synthesizing the core shell particle by adding a Group II raw material containing a Group II element to the solution after the third step to form the second shell.

Here, as the raw material of the second shell, a Group II raw material containing the Group II element described above and a Group VI raw material containing the Group VI element described above are exemplified in a case where the second shell is the Group II-VI semiconductor.

It is preferable to use a compound containing Zn (particularly, a carboxylate of Zn) as the Group II raw material. Further, it is preferable to use alkylthiol as the Group VI raw material.

From the viewpoints of further increasing the core shell ratio of the core shell particle to be obtained and further increasing the luminous efficacy, it is preferable that the fourth step is performed again after the fourth step. The fourth step may be performed several times after the fourth step.

Molar Ratio

As described above, the molar ratio of the Group II raw material added in all steps from the first step to the fourth step to the Group III raw material added in the first step is greater than 3. Due to this, core shell particles in which the core shell ratio is 2.7 or greater are obtained. Further, the "molar ratio of the Group II raw material added in all steps from the first step to the fourth step" indicates the molar ratio of the total value of the Group II raw material added in all steps from the first step to the fourth step, and this means that the total value of the Group II raw material includes not only the Group II raw material added in the fourth step but also the Group II raw material added in the first step in a case where the Group II raw material is also added in the first step.

From the viewpoint of further increasing the luminous efficacy, the molar ratio of the Group II raw material added in all steps from the first step to the fourth step to the Group III raw material added in the first step is preferably in a range of 5.0 to 45.0 and more preferably in a range of 7.0 to 30.0.

The molar ratio of the Group II raw material added in the fourth step to the Group III raw material added in the first step is not particularly limited, but is preferably greater than 3 from the viewpoint of further increasing the luminous efficacy. Further, the molar ratio thereof is preferably in a range of 5.0 to 45.0 and more preferably in a range of 7.0 to 30.0.

Film

The film of the present invention is a film containing the core shell particle of the present invention described above.

Since such a film of the present invention has high luminous efficacy and a narrow luminous half-width and is useful as quantum dots, the film can be applied to a wavelength conversion film used for a display, a photoelectron conversion (or wavelength conversion) film of a solar cell, a biological label, a thin film transistor, and the like.

Particularly, the film of the present invention is suitably applied to a down conversion film or a down shift type wavelength conversion film which absorbs light in a shorter wave region than that of the absorption edge of quantum dots and emits light having a long wave.

Further, the film material as a base material constituting the film of the present invention is not particularly limited and may be a resin or a thin glass film.

Specific examples thereof include resin materials mainly formed of an ionomer, polyethylene, polyvinyl chloride, polyvinylidene chloride, polyvinyl alcohol, polypropylene, polyester, polycarbonate, polystyrene, polyacrylonitrile, an ethylene vinyl acetate copolymer, an ethylene-vinyl alcohol copolymer, an ethylene-methacrylic acid copolymer film, and nylon.

EXAMPLES

Hereinafter, the present invention will be described in more detail based on examples. However, the present invention is not limited to these examples.

Example 1

32 mL of octadecene, 140 mg (0.48 mmol) of indium acetate, 48 mg (0.24 mmol) of zinc acetate, and 364 mg (1.44 mmol) of palmitic acid were added to a flask, heated and stirred at 110° C. in a vacuum, and degassed for 90 minutes while the raw materials were sufficiently dissolved (first step). Next, the flask was heated to 300° C. in a nitrogen flow, and 0.18 mmol of tristrimethylsilylphosphine dissolved in approximately 4 mL of octadecene was added to the flask when the temperature of the solution was stabilized. Thereafter, the flask was heated for 120 minutes in a state in which the temperature of the solution was set to 230° C. It was confirmed that the color of the solution was red and particles (core) were formed (second step). Next, 30 mg (0.18 mmol) of gallium chloride and 125 µL (0.4 mmol) of oleic acid which were dissolved in 8 mL of octadecene were added to the solution in a state in which the solution was heated to 200° C., and the solution was further heated for approximately 1 hour, thereby obtaining a dispersion liquid of a core shell particle precursor including InP (core) doped with Zn and GaP (first shell) (third step).

Next, the dispersion liquid was cooled to room temperature, 513 mg (2.8 mmol) of zinc acetate was added thereto, the dispersion liquid was heated to 230° C., and the temperature thereof was maintained for approximately 4 hours. Next, 2.67 mL (11.3 mmol) of dodecanethiol was added to the dispersion liquid and the dispersion liquid was heated to 240° C. The obtained dispersion liquid was cooled to room temperature, ethanol was added thereto, and centrifugation was performed on the dispersion liquid so that particles were precipitated. The supernatant was disposed and the resultant was dispersed in a toluene solvent. In this manner, a toluene dispersion liquid of core shell particles including InP (core) doped with Zn, GaP (first shell) covering the surface of the core, and ZnS (second shell) covering the surface of the first shell was obtained (fourth step).

Example 2

A dispersion liquid of a core shell particle precursor containing InP (core) doped with Zn and GaP (first shell) covering the surface of the core was obtained by following the same procedures as those in Example 1.

Next, the dispersion liquid was cooled to room temperature, 220 mg (1.2 mmol) of zinc acetate was added thereto, the dispersion liquid was heated to 230° C., and the temperature thereof was maintained for approximately 4 hours. Next, 1.15 mL (4.85 mmol) of dodecanethiol was added thereto, and the dispersion liquid was heated to 240° C. The obtained dispersion liquid was cooled to room temperature, 293 mg (1.6 mmol) of zinc acetate was added thereto again, the dispersion liquid was heated to 230° C., and the temperature thereof was maintained for approximately 1 hour. Subsequently, 1.53 mL (6.5 mmol) of dodecanethiol was added thereto again, and the solution was heated to 240° C. The obtained dispersion liquid was cooled to room temperature, ethanol was added thereto, and centrifugation was performed on the dispersion liquid so that particles were precipitated. The supernatant was disposed and the resultant was dispersed in a toluene solvent. In this manner, a toluene dispersion liquid of core shell particles including InP (core) doped with Zn, GaP (first shell) covering the surface of the core, and ZnS (second shell) covering the surface of the first shell was obtained.

Example 3

A dispersion liquid of a core shell particle precursor containing InP (core) doped with Zn and GaP (first shell) covering the surface of the core was obtained by following the same procedures as those in Example 1 except that 0.18 mmol of tristrimethylsilylphosphine was added in place of 0.24 mmol of tristrimethylsilylphosphine.

Next, the dispersion liquid was cooled to room temperature, 220 mg (1.2 mmol) of zinc acetate was added thereto, the dispersion liquid was heated to 230° C., and the temperature thereof was maintained for approximately 4 hours. Next, 1.15 mL (4.85 mmol) of dodecanethiol was added thereto, and the dispersion liquid was heated to 240° C. The obtained dispersion liquid was cooled to room temperature, 293 mg (1.6 mmol) of zinc acetate was added thereto again, the dispersion liquid was heated to 230° C., and the temperature thereof was maintained for approximately 1 hour. Subsequently, 1.53 mL (6.5 mmol) of dodecanethiol was added thereto again, and the solution was heated to 240° C. The obtained dispersion liquid was cooled to room temperature, ethanol was added thereto, and centrifugation was performed on the dispersion liquid so that particles were precipitated. The supernatant was disposed and the resultant was dispersed in a toluene solvent. In this manner, a toluene dispersion liquid of core shell particles including InP (core) doped with Zn, GaP (first shell) covering the surface of the core, and ZnS (second shell) covering the surface of the first shell was obtained.

Example 4

A toluene dispersion liquid of core shell particles including InP (core) doped with Zn, GaP (first shell) covering the surface of the core, and ZnS (second shell layer) covering the surface of the first shell was obtained by following the same procedures as those in Example 1 except that 880 mg (4.8 mmol) of zinc acetate was added in the fourth step in place of 513 mg (2.8 mmol) of zinc acetate and 4.58 mL (19.4 mmol) of dodecanethiol was added in place of 2.67 mL (11.3 mmol) of dodecanthiol.

Example 5

A dispersion liquid of a core shell particle precursor containing InP (core) doped with Zn and GaP (first shell) covering the surface of the core was obtained by following the same procedures as those in Example 1.

Next, the dispersion liquid was cooled to room temperature, 220 mg (1.2 mmol) of zinc acetate was added thereto, the dispersion liquid was heated to 230° C., and the temperature thereof was maintained for approximately 4 hours. Next, 1.15 mL (4.85 mmol) of dodecanethiol was added thereto, and the dispersion liquid was heated to 240° C. The obtained dispersion liquid was cooled to room temperature, 293 mg (1.6 mmol) of zinc acetate was added thereto again, the dispersion liquid was heated to 230° C., and the temperature thereof was maintained for approximately 1 hour.

Subsequently, 1.53 mL (6.5 mmol) of dodecanethiol was added thereto again, and the solution was heated to 240° C. The obtained dispersion liquid was cooled to room temperature, 367 mg (2.0 mmol) of zinc acetate was added thereto again, the dispersion liquid was heated to 230° C., and the temperature thereof was maintained for approximately 1 hour. Subsequently, 1.91 mL (8.1 mmol) of dodecanethiol was added thereto again, and the solution was heated to 240° C. The obtained dispersion liquid was cooled to room temperature, ethanol was added thereto, and centrifugation was performed on the dispersion liquid so that particles were precipitated. The supernatant was disposed and the resultant was dispersed in a toluene solvent. In this manner, a toluene dispersion liquid of core shell particles including InP (core) doped with Zn, GaP (first shell) covering the surface of the core, and ZnS (second shell) covering the surface of the first shell was obtained.

Example 6

A dispersion liquid of a core shell particle precursor containing InP (core) doped with Zn and GaP (first shell) covering the surface of the core was obtained by following the same procedures as those in Example 1.

Next, the dispersion liquid was cooled to room temperature, 220 mg (1.2 mmol) of zinc acetate was added thereto, the dispersion liquid was heated to 230° C., and the temperature thereof was maintained for approximately 4 hours. Next, 1.15 mL (4.85 mmol) of dodecanethiol was added thereto, and the dispersion liquid was heated to 240° C.

The obtained dispersion liquid was cooled to room temperature, 293 mg (1.6 mmol) of zinc acetate was added thereto again, the dispersion liquid was heated to 230° C., and the temperature thereof was maintained for approximately 1 hour. Subsequently, 1.53 mL (6.5 mmol) of dodecanethiol was added thereto again, and the solution was heated to 240° C.

The obtained dispersion liquid was cooled to room temperature, 367 mg (2.0 mmol) of zinc acetate was added thereto again, the solution was heated to 230° C., and the temperature thereof was maintained for approximately 1 hour. Subsequently, 1.91 mL (8.1 mmol) of dodecanethiol was added thereto again, and the solution was heated to 240° C.

The obtained dispersion liquid was cooled to room temperature, 440 mg (2.4 mmol) of zinc acetate was added thereto again, the solution was heated to 230° C., and the temperature thereof was maintained for approximately 1 hour. Subsequently, 2.30 mL (9.7 mmol) of dodecanethiol was added thereto again, and the solution was heated to 240° C.

The obtained dispersion liquid was cooled to room temperature, 513 mg (2.8 mmol) of zinc acetate was added thereto again, the solution was heated to 230° C., and the temperature thereof was maintained for approximately 1 hour. Subsequently, 2.68 mL (11.3 mmol) of dodecanethiol was added thereto again, and the solution was heated to 240° C.

The obtained dispersion liquid was cooled to room temperature, 586 mg (3.2 mmol) of zinc acetate was added thereto again, the solution was heated to 230° C., and the temperature thereof was maintained for approximately 1 hour. Subsequently, 3.06 mL (12.9 mmol) of dodecanethiol was added thereto again, and the solution was heated to 240° C.

The obtained dispersion liquid was cooled to room temperature, 659 mg (3.6 mmol) of zinc acetate was added thereto again, the solution was heated to 230° C., and the temperature thereof was maintained for approximately 1 hour. Subsequently, 3.44 mL (14.5 mmol) of dodecanethiol was added thereto again, and the solution was heated to 240° C.

The obtained dispersion liquid was cooled to room temperature, 732 mg (4.0 mmol) of zinc acetate was added thereto again, the solution was heated to 230° C., and the temperature thereof was maintained for approximately 1 hour. Subsequently, 3.84 mL (16.2 mmol) of dodecanethiol was added thereto again, and the solution was heated to 240° C.

The obtained dispersion liquid was cooled to room temperature, ethanol was added thereto, and centrifugation was performed on the solution so that particles were precipitated. The supernatant was disposed and the resultant was dispersed in a toluene solvent. In this manner, a toluene dispersion liquid of core shell particles including InP (core) doped with Zn, GaP (first shell) covering the surface of the core, and ZnS (second shell) covering the surface of the first shell was obtained.

Comparative Example 1

A toluene dispersion liquid of core shell particles including InP (core) doped with Zn, GaP (first shell) covering the surface of the core, and ZnS (second shell) covering the surface of the first shell was obtained by following the same procedures as those in Example 1 except that 220 mg (1.2 mmol) of zinc acetate was added in the fourth step in place of 513 mg (2.8 mmol) of zinc acetate and 1.15 mL (4.85 mmol) of dodecanethiol was added in place of 2.67 mL (11.3 mmol) of dodecanthiol.

Comparative Example 2

A toluene dispersion liquid of core shell particles including InP (core) doped with Zn, GaP (first shell) covering the surface of the core, and ZnS (second shell) covering the surface of the first shell was obtained by following the same procedures as those in Example 1 except that 0.24 mmol of tristrimethylsilylphosphine was added in place of 0.18 mmol of tristrimethylsilylphosphine, 220 mg (1.2 mmol) of zinc acetate was added in the fourth step in place of 513 mg (2.8 mmol) of zinc acetate, and 1.15 mL (4.85 mmol) of dodecanethiol was added in place of 2.67 mL (11.3 mmol) of dodecanthiol.

Comparative Example 3

32 mL of octadecene, 140 mg (0.48 mmol) of indium acetate, 48 mg (0.24 mmol) of zinc acetate, and 364 mg (1.44 mmol) of palmitic acid were added to a flask, heated and stirred at 110° C. in a vacuum, and degassed for 90 minutes while the raw materials were sufficiently dissolved.

Next, the flask was heated to 300° C. in a nitrogen flow, and 0.18 mmol of tristrimethylsilylphosphine dissolved in approximately 4 mL of octadecene was added to the flask when the temperature of the solution was stabilized. Thereafter, the flask was heated for 120 minutes in a state in which the temperature of the solution was set to 230° C. It was confirmed that the color of the solution was red and particles were formed.

Next, the solution was cooled to room temperature, 513 mg (2.8 mmol) of zinc acetate was added thereto, the solution was heated to 230° C., and the temperature thereof was maintained for approximately 4 hours. Next, 2.67 mL (11.3 mmol) of dodecanethiol was added to the solution and the solution was heated to 240° C. The obtained solution was cooled to room temperature, ethanol was added thereto, and centrifugation was performed on the solution so that particles were precipitated. The supernatant was disposed and the resultant was dispersed in a toluene solvent.

In this manner, a toluene dispersion liquid of core shell particles including InP (core) doped with Zn and ZnS (shell) covering the surface of the core was obtained.

Core Shell Ratio

In the obtained core shell particles, the molar ratio (core shell ratio) of the Group II element (Zn) contained in the entirety of the core shell particles to the Group III element (In) contained in the core was acquired using XPS. The details of the method of acquiring the core shell ratio are as described above. The results are listed in Table 1.

The "composition" in Table 1 indicates the composition (mmol) at the time of production of core shell particles.

Further, the abbreviations are as follows.

In acetate: indium acetate
Zn acetate (first step): zinc acetate added in the first step
TTMSP: tristrimethylsilylphosphine
Ga chloride: gallium chloride
Zn acetate (fourth step): zinc acetate added in the fourth step
DDT: dodecanethiol Further, the "number of times of fourth step" indicates the number of performing the fourth step.

Further, the "core shell ratio" indicates the molar ratio of the Group II element (Zn) contained in the entirety of the core shell particles to the Group III element (In) contained in the core was acquired using XPS. The details of the method of acquiring the core shell ratio are as described above.

TABLE 1

| | Composition [mmol] | | | | | | Number of | | |
|---|---|---|---|---|---|---|---|---|---|
| | In acetate | Zn acetate (first step) | TTMSP | Ga chloride | Zn acetate (fourth step) | DDT | Core shell ratio | times of fourth step | Luminous efficacy (%) | Half-width [nm] |
| Example 1 | 0.48 | 0.24 | 0.18 | 0.18 | 2.8 | 11.3 | 3.0 | 1 time | 77.6 | 67 |
| Example 2 | 0.48 | 0.24 | 0.18 | 0.18 | 2.8 | 11.4 | 4.9 | 2 times | 78.3 | 67 |
| Example 3 | 0.48 | 0.24 | 0.24 | 0.18 | 2.8 | 11.4 | 4.9 | 2 times | 81.8 | 67 |
| Example 4 | 0.48 | 0.24 | 0.18 | 0.18 | 4.8 | 19.4 | 4.5 | 1 time | 77.5 | 67 |
| Example 5 | 0.48 | 0.24 | 0.18 | 0.18 | 4.8 | 19.5 | 5.5 | 3 times | 82.5 | 67 |
| Example 6 | 0.48 | 0.24 | 0.18 | 0.18 | 43.3 | 175.0 | 15.8 | 8 times | 75.6 | 72 |
| Comparative Example 1 | 0.48 | 0.24 | 0.18 | 0.18 | 1.2 | 4.85 | 2.6 | 1 time | 70.8 | 67 |
| Comparative Example 2 | 0.48 | 0.24 | 0.24 | 0.18 | 1.2 | 4.85 | 1.7 | 1 time | 51.5 | 86 |
| Comparative Example 3 | 0.48 | 0.24 | 0.18 | 0.18 | 2.8 | 11.3 | 3.6 | 1 time | 45.2 | 68 |

Luminous Efficacy

The emission intensity of the obtained dispersion liquid of the core shell particles was measured using a fluorescence spectrophotometer FluoroMax-3 (manufactured by HORIBA Jobin Yvon) by adjusting the concentration thereof such that the absorbance at an excitation wavelength of 450 nm was set to 0.2. The luminous efficacy was calculated by performing comparison with a quantum dot sample whose luminous efficacy was known. The obtained luminous efficacy was calculated as a ratio of the number of emission photons to the number of absorption photons from excitation light. The results are listed in Table 1.

Luminous Half-Width

The half-width of the obtained dispersion liquid of the core shell particles was acquired by measuring the fluorescence spectrum using light having an excitation wavelength of 450 nm at room temperature. Specifically, each wavelength whose intensity was half the peak intensity of a fluorescence spectrum to be observed was acquired and the half-width was calculated from a difference in wavelength. The results are listed in Table 1.

As shown from Table 1, the core shell particles exhibited high luminous efficacy in Examples 1 to 6 in which the core shell ratio was 2.7 or greater compared to Comparative Examples 1 and 2 in which the core shell ratio was less than 2.7. Among the examples, the core shell particles exhibited higher luminous efficacy in Examples 2, 3, and 5 in which the core shell ratio was in a range of 4.6 to 15.0. Among the examples, the core shell particles exhibited still higher luminous efficacy in Example 5 in which the core shell ratio was in a range of 5.0 to 15.0. In addition, in a case of the core shell particles having only one layer of shell even when the core shell ratio was 2.7 or greater, it was understood that the luminous half-width was narrowed and the luminous efficacy was decreased (Comparative Example 3).

Further, based on the comparison between Example 1 and Example 2 and the comparison between Example 4 and Example 5, the core shell ratio was higher and the core shell particles exhibited higher luminous efficacy in Examples 2 and 5 in which the fourth step was performed again after the fourth step.

What is claimed is:
1. A core shell particle comprising:
a core which contains a Group III element and a Group V element;
a first shell which covers at least a part of a surface of the core; and
a second shell which contains a Group II element and covers at least a part of the first shell, wherein the molar ratio of the Group II element contained in the entirety of the core shell particle to the Group III element contained in the core, which is acquired using X-ray photoelectron spectroscopy, is 2.7 or greater, the core further contains a Group II element, the Group III element contained in the core is In, the Group V element contained in the core is P, and the Group II element contained in the core is Zn.

2. The core shell particle according to claim 1, wherein the molar ratio is 3.0 or greater.

3. The core shell particle according to claim 1, wherein the first shell contains a Group II element or a Group III element, where, in a case where the first shell contains a Group III element, the Group III element contained in the first shell is a Group III element different from the Group III element contained in the core.

4. The core shell particle according to claim 1, wherein the first shell is a Group II-VI semiconductor which contains a Group II element and a Group VI element or a Group III-V semiconductor which contains a Group III element and a Group V element, where, in a case where the first shell is the Group III-V semiconductor, the Group III element contained in the Group III-V semiconductor is a Group III element different from the Group III element contained in the core.

5. The core shell particle according to claim 4, wherein in a case where the first shell is the Group II-VI semiconductor, the Group II element is Zn and the Group VI element is Se, and in a case where the first shell is the Group III-V semiconductor, the Group III element is Ga and the Group V element is P.

6. The core shell particle according to claim 4, wherein the first shell is the Group III-V semiconductor, the Group III element is Ga, and the Group V element is P.

7. The core shell particle according to claim 1, wherein the second shell is a Group II-VI semiconductor which contains a Group II element and a Group VI element.

8. The core shell particle according to claim 7, wherein the second shell is the Group II-VI semiconductor, the Group II element is Zn, and the Group VI element is S.

9. The core shell particle according to claim 1, wherein the core, the first shell, and the second shell are respectively a crystal system having a zinc blende structure.

10. The core shell particle according to claim 1, wherein, among the core, the first shell, and the second shell, a band gap of the core is the smallest, and the core and the first shell respectively have a type 1 band structure.

11. A method of producing the core shell particle according to claim 1, the method comprising:

a first step of heating and stirring a solution obtained by adding a Group III raw material which contains a Group III element to a solvent;

a second step of forming a core by adding a Group V raw material which contains a Group V element to the solution after the first step;

a third step of forming a first shell by adding a raw material of the first shell to the solution after the second step; and a fourth step of synthesizing a core shell particle by adding a Group II raw material which contains a Group II element to the solution after the third step and by forming a second shell, wherein the molar ratio of the Group II raw material added in all steps from the first step to the fourth step to the Group III raw material added in the first step is greater than 3.0.

12. The method according to claim 11, wherein the Group III raw material is a compound containing In.

13. The method according to claim 11, wherein the Group V raw material is a compound containing P.

14. The method according to claim 11, wherein the raw material of the first shell is a compound containing Ga.

15. The method according to claim 14, wherein the raw material of the first shell is a chloride of Ga.

16. The method according to claim 11, wherein the raw material of the second shell is a compound containing Zn.

17. The method according to claim 16, wherein the raw material of the second shell is a carboxylate of Zn.

18. A film which contains the core shell particle according to claim 1.

* * * * *